US006913069B2

(12) United States Patent
Barsun et al.

(10) Patent No.: US 6,913,069 B2
(45) Date of Patent: Jul. 5, 2005

(54) COOLING DEVICE HAVING FINS ARRANGED TO FUNNEL AIR

(75) Inventors: Stephan Karl Barsun, Davis, CA (US); Andrew Harvey Barr, Roseville, CA (US); Robert William Dobbs, Granite Bay, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/641,502

(22) Filed: Aug. 14, 2003

(65) Prior Publication Data

US 2005/0034845 A1 Feb. 17, 2005

(51) Int. Cl.⁷ .................................................. F28F 7/00
(52) U.S. Cl. ...................... 165/80.3; 165/185; 361/697; 361/703; 174/16.3; 257/706
(58) Field of Search ................................ 165/80.3, 185; 361/697, 703, 704; 257/706, 722; 174/16.3

(56) References Cited

U.S. PATENT DOCUMENTS

| 4,765,397 | A | * | 8/1988 | Chrysler et al. | ........ | 165/104.33 |
| 4,953,634 | A | * | 9/1990 | Nelson et al. | .............. | 165/147 |
| 5,002,123 | A | * | 3/1991 | Nelson et al. | .............. | 165/147 |
| 5,860,472 | A | * | 1/1999 | Batchelder | ................... | 165/185 |
| 5,957,194 | A | * | 9/1999 | Azar | ......................... | 165/80.3 |
| 6,089,315 | A | * | 7/2000 | Lee et al. | .................... | 165/185 |
| 6,313,399 | B1 | * | 11/2001 | Suntio et al. | ........... | 174/17 VA |
| 6,364,009 | B1 | * | 4/2002 | MacManus et al. | ........ | 165/185 |
| 6,370,025 | B1 | * | 4/2002 | Yasufuku et al. | ........... | 361/704 |

* cited by examiner

Primary Examiner—Terrell McKinnon

(57) ABSTRACT

Described are devices for cooling a component, and methods thereof. The device includes a base that can be coupled to the component so that heat is transferred from the component to the base. The device also includes fins coupled to the base. The fins are arranged to funnel air from an air intake end of the device toward a location on the base.

18 Claims, 2 Drawing Sheets

```
50      ┌─────────────────────────────────┐
        │              52                 │
        │  TRANSFER HEAT FROM COMPONENT   │
        │            TO BASE              │
        └─────────────────────────────────┘
                         │
                         ▼
        ┌─────────────────────────────────┐
        │              54                 │
        │ FUNNEL AIR TO A LOCATION ON THE │
        │ BASE USING NON-PARALLEL FINS    │
        └─────────────────────────────────┘
```

COOLING DEVICE HAVING FINS ARRANGED TO FUNNEL AIR

TECHNICAL FIELD

Embodiments of the present invention relate to cooling units. More specifically, embodiments of the present invention pertain to heat sinks and heat exchangers.

BACKGROUND ART

A device commonly used to cool components such as processors includes a base element that has a flat surface that can be tightly fit against the component to be cooled. The opposite surface of the base element has a number of fins. Heat from the component is transferred to the base element. The fins enhance dissipation of the heat from the base element. Using a fan, air is directed over the base element and past the fins.

Electrical components are becoming smaller yet more powerful, and keeping them cool is becoming more challenging. For instance, higher performance processors generate more heat than their lower performance counterparts, and are smaller in size than their predecessors.

The problem of keeping computer components cool is compounded because the trend is to put these higher performance (higher heat load) components into smaller chassis or cases. A consequence of this trend is that less height is available within the cases for cooling units. This problem is expressly evident in servers such as rack-mountable servers (e.g., 1U form factor servers), where only about 1.75 inches of height is available. The challenge of cooling computer components is further compounded because these reduced-height servers are densely packed with components and circuitry, limiting air flow both in volume and direction.

A conventional approach to solving the above problems is to add ducting to improve air flow to the components to be cooled. However, this solution results in increased costs. Greater volume cases can be used, but they negate the preference for smaller cases. Larger cases also mean that fewer servers can be placed into a room or rack of a given size. Lower power components can be used, but then the performance of the server would be reduced.

Accordingly, a method and/or device that can provide improved cooling of smaller and more powerful components would be advantageous. A method and/of device that can accomplish this within the confines of the smaller cases currently in use, without significantly increasing costs or reducing performance, would be particularly advantageous. Embodiments of the present invention provide these and other advantages.

DISCLOSURE OF THE INVENTION

Embodiments of the present invention pertain to devices for cooling a component, and to methods thereof. In one embodiment, a cooling device includes a base that can be coupled to a component to be cooled, so that heat is transferred from the component to the base. The device also includes fins coupled to the base. The fins are arranged to funnel air from an air intake end of the device toward a location on the base.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should not be understood as being drawn to scale except if specifically noted.

BEST MODE FOR CARRYING OUT THE INVENTION

Reference will now be made in detail to various embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following description of the present invention, numerous specific details are set forth in order to provide a thorough understanding of the present invention. In other instances, well-known methods, procedures, components, and circuits have not been described in detail as not to unnecessarily obscure aspects of the present invention.

Aspects of the present invention may be implemented in a computer system that includes, in general, a processor for processing information and instructions, random access (volatile) memory (RAM) for storing information and instructions, read-only (non-volatile) memory (ROM) for storing static information and instructions, a data storage device such as a magnetic or optical disk and disk drive for storing information and instructions, an optional user output device such as a display device (e.g., a monitor) for displaying information to the computer user, an optional user input device including alphanumeric and function keys (e.g., a keyboard) for communicating information and command selections to the processor, and an optional user input device such as a cursor control device (e.g., a mouse) for communicating user input information and command selections to the processor.

Figure 1A:
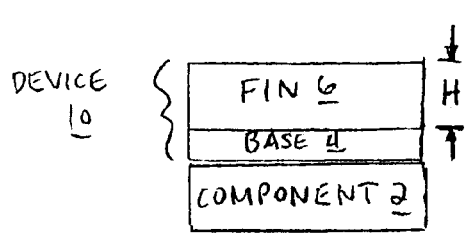
FIG. 1A illustrates one view (e.g., a side view) of a cooling device mounted on a component according to one embodiment of the present invention.

FIG. 1A illustrates a side view of a cooling device 10 mounted on a component 2 according to one embodiment of the present invention. Cooling device 10 can also be referred to as a heat sink. The component 2 can be an electrical component. In particular, component 2 can be an electrical component, such as a processor or integrated circuit, that is utilized in a computer system (e.g., within the computer system housing). In general, component 2 generates heat, and the function of cooling device 10 is to remove that heat and dissipate it to the environment, thereby cooling component 2.

In the present embodiment, the cooling device 10 includes a base element 4 and a number of fins exemplified by fin 6. Fin 6 has a height "H." The fins can be of uniform height, although the present invention is not so limited.

Figure 1B:
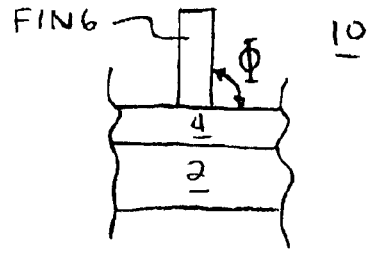
FIG. 1B illustrates another view (e.g., an end view) of a cooling device mounted on a component according to one embodiment of the present invention.

In FIG. 1A, fin 6 is illustrated lengthwise, extending from the base 4. FIG. 1B illustrates an end view of a portion of the cooling device 10 showing fin 6 extending from the base 4. The fin 6 forms an angle $\Phi$ with the base 4. The angle $\Phi$ can be virtually any angle. In one embodiment, the angle $\Phi$ is a right angle (or approximately a right angle).

The base 4 and the fins can be made of any suitable material including, but not limited to, aluminum or copper. The cooling device 10 is said to be "thermally coupled" to the component 2, meaning that the base 4 is fit tightly against the component 2 in order to facilitate heat transfer from the component 2 into the base 4. A thermal compound of a type known in the art can be used between the base 4 and the component 2 to further facilitate heat transfer. Although component 2 and base 4 are illustrated as being similarly dimensioned, this need not be the case. In addition, as will be seen, the length of fin 6 can be different than the length of base 4.

Figure 2:
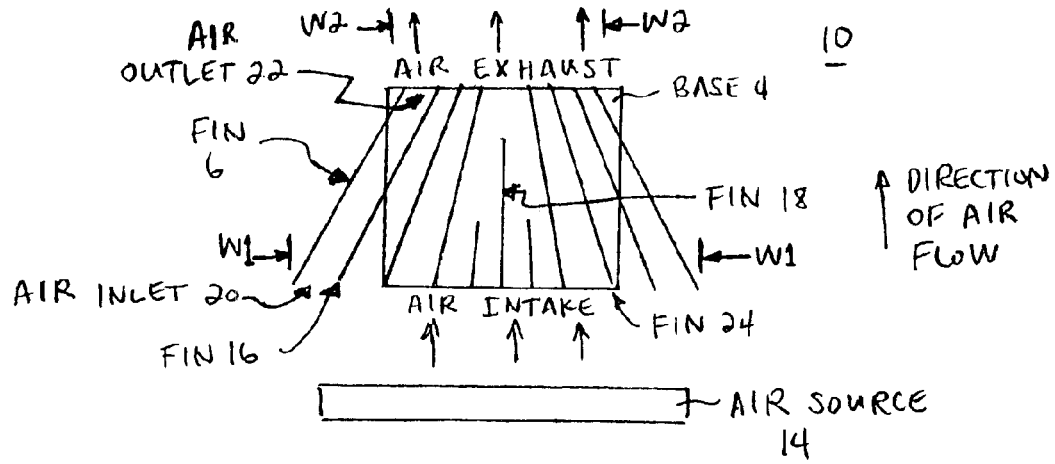
FIG. 2 illustrates a horizontal cross-sectional (top down) view of a cooling device according to one embodiment of the present invention.

FIG. 2 illustrates a horizontal cross-sectional (e.g., top down) view of a cooling device 10 according to one embodiment of the present invention. FIG. 2 shows the arrangement of a number of fins exemplified by fins 6, 16, 18 and 24. As mentioned above in conjunction with FIG. 1B, each of the fins is mounted at some angle relative to the plane formed by base 4. This angle may be the same for each of the fins, or this angle may be different for one or more of the fins.

Although a particular number of fins might be suggested by FIG. 2, the present invention is not so limited. The number of fins, as well as other considerations such as the spacing between fins, are implementation-specific, depending on characteristics such as the amount of space available, the amount of air available, and cooling requirements.

Of significance, the fins of cooling device 10, when viewed from the perspective of FIG. 2, are non-parallel to each other. In other words, the fins converge on each other in the direction of air flow; the fins converge on a location downstream of the air intake side of cooling device 10. Although all of the fins are shown as being nonparallel (convergent), the present invention is not so limited. That is, in an alternative embodiment, some of the fins can be parallel to each other, while other fins can be nonparallel.

In the embodiment of FIG. 2, the fins of cooling device 10 are more spread out at the air intake side of the device relative to the air exhaust side of the device. Put another way, the fins diverge as they approach the air intake side of cooling device 10. More precisely, the air flow region at the air intake side is wider than the air flow region at the air exhaust side. A measure across the air intake side, designated "W1" in FIG. 2, is greater than a measure across the air exhaust side, designated "W2" in FIG. 2.

By virtue of the wider fin arrangement at the air intake side, more air can be captured and directed through the fins versus conventional designs. Accordingly, additional ducting can be avoided, saving costs. In addition, the component 2 and cooling device 10 can be placed closer to an air source 14 because additional space for ducting can also be avoided. Moreover, turbulent air from the air source 14 is more readily captured and guided through cooling device 10.

In one embodiment, the air source 14 is situated at the air intake side of cooling device 10. Alternatively, the air source 14 can be situated at the air exhaust side of cooling device 10. Also, multiple air sources can be used at either or both ends of cooling device 10. In one embodiment, air source 14 is a fan. Other types of air sources, such as blowers, can be used instead of or in combination with a fan.

The fins of cooling device 10 can be arranged to funnel or channel air toward a location on the base 4. This location may correspond to the region of base 4 that is expected to experience the highest temperature. Thus, the fins can be arranged to cool base 4 in entirety while enhancing cooling at a particular location on base 4. Enhanced cooling of multiple locations on base 4 can be achieved by suitable arrangement of the fins.

In the embodiment of FIG. 2, some of the fins (e.g., fins 6, 16 and 24) extend the length of the cooling device 10, from the air intake side to the air exhaust side, while other fins (e.g., fin 18) extend only partially across the length of the cooling device. In such an embodiment, the number of air inlets (e.g., air inlet 20) defined by the fins at the air intake side of cooling device 10 is greater than the number of air outlets (e.g., air outlet 22) defined by the fins at the air exhaust side of cooling device 10. Such use of partial length fins avoids overcrowding of fins at the air exhaust end of the cooling device 10. By avoiding overcrowding of fins, the pressure drop across the cooling device 10 remains satisfactory, facilitating air flow through the fins.

Figure 3:
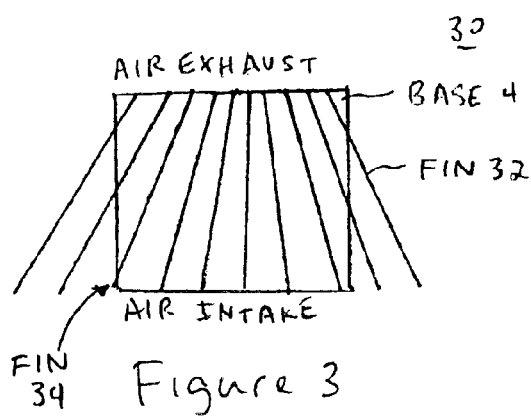
FIG. 3 illustrates a horizontal cross-sectional (top down) view of a cooling device according to another embodiment of the present invention.

However, in an alternative embodiment, partial length fins are not used. FIG. 3 illustrates a horizontal cross-sectional (top down) view of a cooling device 30 according to such an embodiment. In cooling device 30, all of the fins (exemplified by fins 32 and 34) extend the length of the cooling device from the air intake end to the air exhaust end. The fins can be arranged so that overcrowding of fins is not of concern.

Note that in the embodiments of FIGS. 2 and 3, some of the fins (such as fins 6, 16 and 32) are situated both within and without the footprint of the base 4, while other fins (exemplified by fins 24 and 34) are situated entirely within the footprint of base 4.

Figures 4, 5:
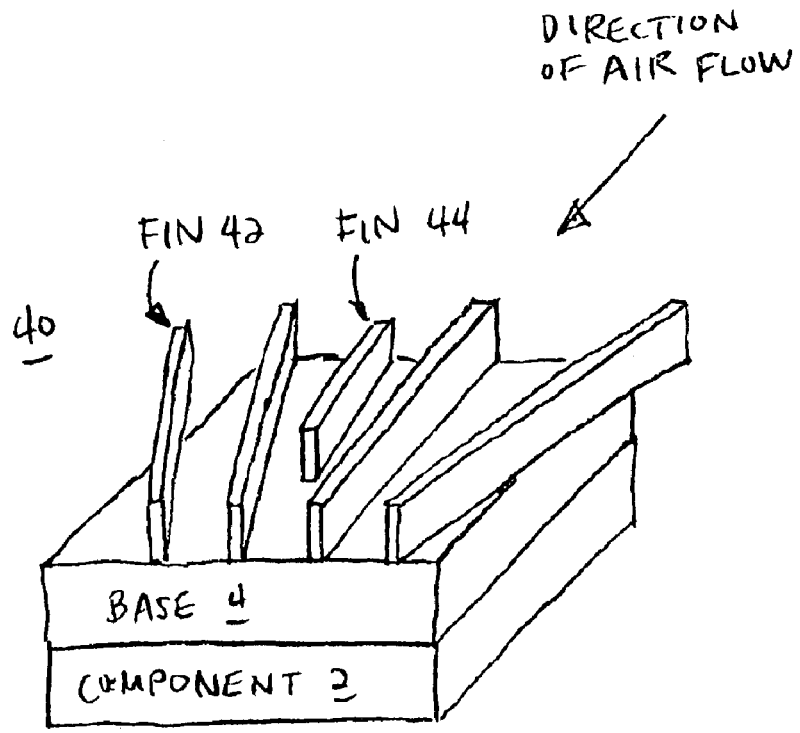
FIG. 4 is a perspective view of a cooling device according to one embodiment of the present invention.
FIG. 5 is a flowchart of a method for cooling a component according to one embodiment of the present invention.

FIG. 4 is a perspective view of a cooling device 40 according to one embodiment of the present invention. As described above, the fins in cooling device 40 are nonparallel, converging on each other toward the air exhaust end of the cooling device. In the example of FIG. 4, the cooling device 40 includes a number of fins (exemplified by fin 42) that extend from the air intake end to the air exhaust end, and a fin 44 that extends only partially across the length of the cooling device. Other fin arrangements are possible.

FIG. 5 is a flowchart 50 of a method for cooling a component according to one embodiment of the present invention. Although specific steps are disclosed in flowchart 50, such steps are exemplary. That is, embodiments of the present invention are well suited to performing various other steps or variations of the steps recited in flowchart 50. It is appreciated that the steps in flowchart 50 may be performed in an order different than presented, and that not all of the steps in the flowchart may be performed.

In step 52, referring to FIGS. 1 and 5, heat is transferred from the component to be cooled (e.g., component 2) to a base element of a cooling device (e.g., base 4).

In step 54 of FIG. 5, air is funneled to a location on the base element using fins that are nonparallel and that converge on each other toward the aforementioned location. The location can be virtually anywhere on the base, ranging at one extreme from the air exhaust end of the cooling device toward the other extreme at the air intake end of the cooling device.

In summary, embodiments of the present invention provide improved cooling of smaller and more powerful components such as electrical components used in computer systems, particularly computer systems that use smaller chassis, without significantly increasing costs or reducing performance.

Embodiments of the present invention are thus described. While the present invention has been described in particular embodiments, it should be appreciated that the present invention should not be construed as limited by such embodiments, but rather construed according to the following claims.

What is claimed is:

1. A device for cooling a component, said device comprising:
    a base that is thermally couplable to said component to transfer heat from said component to said base; and
    a plurality of fins coupled to said base, said fins arranged to funnel air from an air intake end of said device toward a location on said base, wherein the air flow area at said air intake end is wider than the air flow area at said location, wherein said air flows in a direction from said air intake end toward said location, and wherein a fin in said plurality of fins extends beyond an edge of said base.

2. The device of claim 1 wherein a first portion of said fins extend from said air intake end to an air exhaust end of said device, while a second portion of said fins extend only partially across the length of said device.

3. The device of claim 1 wherein said fins define a number of inlets at said air intake end and a number of outlets at an air exhaust end of said device, wherein said number of inlets is greater than said number of outlets.

4. The device of claim 1 further comprising an air source disposed proximate to said air intake end, said air source for moving air toward said device.

5. The device of claim 1 further comprising an air source disposed proximate to an air exhaust end of said device, said air source for moving air away from said device.

6. The device of claim 1 wherein said fins are substantially perpendicular to said base.

7. The device of claim 1 wherein said fins are not parallel to each other, said fins diverging from said location to said air intake end.

8. The device of claim 1 wherein said component is an electrical component situated within a computer system housing.

9. A device for cooling a component, said device comprising:
    a base that is thermally couplable to said component to transfer heat from said component to said base; and
    a plurality of fins coupled to said base, said fins comprising a first fin and a second fin that converge on each other toward a location on said base, wherein said first and second fins channel air toward said location, wherein said air flows in the direction of convergence, and wherein said fins define a number of inlets at an air intake end of said device and a number of outlets at an air exhaust end of said device, wherein said number of inlets is greater than said number of outlets.

10. The device of claim 9 wherein a first portion of said fins extend across the length of said base while a second portion of said fins extend only partially across said length.

11. The device of claim 9 further comprising an air source disposed proximate to an air intake end of said device, said air source for moving air toward said device.

12. The device of claim 9 further comprising an air source disposed proximate to an air exhaust end of said device, said air source for moving air away from said device.

13. The device of claim 9 wherein said fins are substantially perpendicular to said base.

14. The device of claim 9 wherein said component is an electrical component situated within a computer system housing.

15. A method for cooling a component, said method comprising:
    transferring heat from said component to a base element; and
    funneling air to a location on said base element using fins coupled to said base element, said fins comprising a first fin and a second fin that is nonparallel to said first fin, said first and second fins converging on each other toward said location, wherein said air flows in the direction of convergence, and wherein said fins define a number of air inlets and a number of air outlets, wherein said number of air inlets is greater than said number of air outlets.

16. The method of claim 15 wherein a first portion of said fins extend across the length of said base element while a second portion of said fins extend only partially across said length.

17. The method of claim 15 wherein said fins are substantially perpendicular to said base element.

18. The method of claim 15 wherein said component is an electrical component situated within a computer system housing.

* * * * *